United States Patent
Chen et al.

(10) Patent No.: US 7,512,863 B2
(45) Date of Patent: Mar. 31, 2009

(54) TURBO CODE INTERLEAVER FOR LOW FRAME ERROR RATE

(75) Inventors: Pei Chen, San Diego, CA (US); Ahmad Jalali, Rancho Santa Fe, CA (US)

(73) Assignee: Qualcomm Corporation, San Diego, CA (US)

( * ) Notice: Subject to any disclaimer, the term of this patent is extended or adjusted under 35 U.S.C. 154(b) by 590 days.

(21) Appl. No.: 11/249,293

(22) Filed: Oct. 12, 2005

(65) Prior Publication Data

US 2007/0083803 A1    Apr. 12, 2007

(51) Int. Cl.
H03M 13/00    (2006.01)
(52) U.S. Cl. ..................................... 714/755
(58) Field of Classification Search ............... 714/755
See application file for complete search history.

(56) References Cited

U.S. PATENT DOCUMENTS

| | | | | |
|---|---|---|---|---|
| 6,553,516 B1 * | 4/2003 | Suda et al. | ................... | 714/702 |
| 7,155,642 B2 * | 12/2006 | Han | ........................... | 714/701 |
| 2002/0159423 A1 | 10/2002 | Yao et al. | | |
| 2003/0026346 A1 | 2/2003 | Matsumoto et al. | | |
| 2004/0184560 A1 * | 9/2004 | Shen et al. | ................... | 375/308 |

FOREIGN PATENT DOCUMENTS

WO    0269506 A2    6/2002

OTHER PUBLICATIONS

"3RD Generation Partnership Project" 3G TS 25 212 V3.0.0 XX, XX, Jun. 2000, pp. 1-62, XP002202956, pp. 13, 14, pp. 16-20, Figures 1, 2, 4.

* cited by examiner

*Primary Examiner*—Esaw T Abraham
*Assistant Examiner*—Sam Rizk
(74) *Attorney, Agent, or Firm*—Amin, Turocy & Calvin, LLP

(57) ABSTRACT

At least one aspect of the invention provides a turbo encoder having parallel first and second constituent encoders and an interleaver coupled as an input to the second constituent encoder to provide a permutated version of the binary data input to the first constituent encoder to achieve a low frame error rate. The interleaver is configured to parse the binary data input into an input block, determine a permutation vector, and rearrange the order of the binary data in the input block according to a set of predetermined permutation equations. The rearranged binary data in the information block is then passed to the second constituent encoder to improve the distance spectrum of the transmitted redundant data.

24 Claims, 7 Drawing Sheets

| Information block length ($N_{turbo}$) | $k_1$ | $k_2$ |
|---|---|---|
| 512 | 8 | 64 |
| 1024 | 8 | 64 * 2 |
| 2048 | 8 | 64 * 4 |
| 3072 | 8 | 64 * 6 |
| 4096 | 8 | 64 * 8 |

Figure 8

| Information block length ($N_{turbo}$) | $p_1, p_2, p_3, p_4$ | $c_1, c_2, c_3, c_4$ |
|---|---|---|
| 512 | 11, 19, 31, 37 | 5, 11, 19, 31 |
| 1024 | 11, 19, 31, 37 | 5, 11, 19, 31 |
| 2048 | 13, 23, 31, 37 | 7, 13, 23, 31 |
| 3072 | 31, 41, 67, 79 | 13, 23, 29, 41 |
| 4096 | 31, 47, 67, 83 | 13, 23, 31, 47 |

Figure 9

TURBO CODE INTERLEAVER FOR LOW FRAME ERROR RATE

BACKGROUND

1. Field

At least one feature relates to digital communication systems, and more specifically, an improved turbo encoder having a low frame error rate.

2. Background

Communication systems use numerous techniques to increase the amount of information transferred while minimizing transmission errors. In these communication systems, the information is typically represented as a sequence of binary bits or blocks of bits called frames. The binary information is modulated to signal waveforms and transmitted over a communication channel. Communication channels tend to introduce noise and interference that corrupt the transmitted signal. At a receiver the received information may be corrupted and is an estimate of the transmitted binary information. The number of bit errors or frame errors depends on the amount of noise and interference in the communication channel.

To counter the effects of transmission channel corruption, error correction coding is often used in digital communication systems to protect the digital information from noise and interference and reduce the number of bit/frame errors. Channel coding is typically accomplished by selectively introducing redundant bits into the transmitted information stream. These additional bits allow detection and correction of bit errors in the received data stream thereby providing more reliable transmissions. One challenge is to achieve a low bit error rate, which translates to a low frame error rate, with an error correction coding scheme that is simple enough and fast enough to be implemented in hardware and/or software.

A well-known axiom in communications theory is that a randomly chosen code of sufficiently large block length n is capable of approaching the Shannon channel capacity limit. The maximum-likelihood (ML) decoding of such a code increases exponentially with n up to a point where decoding becomes physically unrealizable. Thus, another challenge is to develop error correction codes that have large equivalent block lengths, yet contain enough structure that practical decoding is possible.

One type of error correcting code is a parallel concatenated code, better known as turbo code, which is known to have a near-Shannon-limit error correcting performance. The basis of turbo coding is to introduce redundancy in the data to be transmitted through a channel. The redundant data helps to recover original data from the received data.

One implementation of a turbo code provides a parallel concatenation of two component convolutional codes or constituent encoders separated by a random interleaver. Partly due to the pseudo-random interleaver providing a "random" appearance, a turbo code can achieve a transmission performance to within 1 dB of the Shannon channel capacity. However, the problem in designing such interleaver is determining a scheme that rearranges the binary data to have a random appearance and thereby improve the distance spectrum of the transmitted redundant data therein.

SUMMARY

One feature of the invention provides a turbo code having a low frame error rate. In one implementation, a turbo encoder having parallel concatenated encoders and a block interleaver is configured to rearrange the order of input bits or symbols to improve the distance spectrum of the transmitted redundant data.

Another implementation provides a turbo encoder comprising (1) a first constituent encoder configured to receive a binary data stream and process the binary data stream to provide a first output of one or more symbols; (2) a turbo interleaver configured to rearrange the order of the binary data according to a plurality of predetermined permutation equations; and (3) a second constituent encoder communicatively coupled to the turbo interleaver, the second constituent encoder to receive the rearranged binary data and process the rearranged binary data to provide a second output of one or more symbols. The turbo encoder may further include a symbol mapper communicatively coupled to the first and second constituent encoders to receive the first and second outputs and map one or more symbols in the first output and the second output into a carrier signal. The turbo interleaver may be further configured to (1) generate a $k_1 \times k_2$ permutation matrix with values $\pi_i(j)$, where $1 \leq i \leq k_1$ and $0 \leq j \leq k_2-1$, and $k_1 \times k_2 = N_{turbo}$, $N_{turbo}$ is an integer corresponding to a block length of binary data, wherein the predetermined permutation equations define the permutation matrix values $\pi_i(j)$, and (2) convert the permutation matrix into a permutation vector that defines the order of the rearranged binary data.

In one example, the permutation values $\pi_i(j)$ in the $k_1$ by $k_2$ permutation matrix are defined by the permutation equations:

$1^{st}$ row: $\pi_1(j)=k_1*[(p_2*j) \bmod k_2]+4$ $2^{nd}$ row: $\pi_2(j)=k_1*[(p_2*j+c_2) \bmod k_2]+3$ $3^{rd}$ row: $\pi_3(j)=k_1*[(p_1*j) \bmod k_2]+2$ $4^{th}$ row: $\pi_4(j)=k_1*[(p_1*j+c_1) \bmod k_2]+1$ $5^{th}$ row: $\pi_5(j)=k_1*[(p_4*j) \bmod k_2]+8$ $6^{th}$ row: $\pi_6(j)=k_1*[(p_4*j+c_4) \bmod k_2]+7$ $7^{th}$ row: $\pi_7(j)=k_1*[(p_3*j) \bmod k_2]+6$ $8^{th}$ row: $\pi_8(j)=k_1*[(p_3*j+c_3) \bmod k_2]+5$ where $p_1$, $p_2$, $p_3$, $p_4$, and $c_1$, $c_2$, $c_3$, $c_4$ are prime number coefficients. In various implementations, for the following block lengths $N_{turbo}$ the parameters for these permutation equations are $N_{turbo}$=512 bits, $k_1$=8, $k_2$=64, $\{p_1, p_2, p_3, p_4\}$=$\{11, 19, 31, 37\}$, and $\{c_1, c_2, c_3, c_4\}$=$\{5, 11, 19, 31\}$;

$N_{turbo}$=1024 bits, $k_1$=8, $k_2$=128, $\{p_1, p_2, p_3, p_4\}$=$\{11, 19, 31, 37\}$, and $\{c_1, c_2, c_3, c_4\}$=$\{5, 11, 19, 31\}$;

$N_{turbo}$=2048 bits, $k_1$=8, $k_2$=256, $\{p_1, p_2, p_3, p_4\}$=$\{13, 23, 31, 37\}$, and $\{c_1, c_2, c_3, c_4\}$=$\{7, 13, 23, 31\}$;

$N_{turbo}$=3072 bits, $k_1$=8, $k_2$=384, $\{p_1, p_2, p_3, p_4\}$=$\{31, 41, 67, 79\}$, and $\{c_1, c_2, c_3, c_4\}$=$\{13, 23, 29, 41\}$; and $N_{turbo}$=4096 bits, $k_1$=8, $k_2$=512, $\{p_1, p_2, p_3, p_4\}$=$\{31, 47, 67, 83\}$, and $\{c_1, c_2, c_3, c_4\}$=$\{13, 23, 31, 47\}$.

Yet another example provides an interleaver comprising: (1) an input interface to receive a binary data stream; (2) a data sampler communicatively coupled to the input interface, the data sampler configured to sample and divide the binary data stream into input blocks; and (3) a processing unit communicatively coupled to the data sampler to rearrange the order of the binary data in the input blocks according to a plurality of predetermined permutation equations and provide output blocks having the rearranged binary data.

One implementation provides a method of encoding binary information comprising: (1) providing a binary data stream to a first constituent encoder, (2) providing the binary data stream to a turbo interleaver coupled to a second constituent decoder, (3) the turbo interleaver configured to (a) generate a permutation vector having values $\pi(s)$, where $1 \leq s \leq N_{turbo}$ and $N_{turbo}$ is an integer corresponding to a block length of binary data, and (b) rearrange the order of the binary data according to the permutation vector values $\pi(s)$; and (4) providing the rearranged binary data to the second constituent encoder. The method may further comprise (5) processing the binary data stream at the first constituent encoder to generate a first output of one or more symbols; (6) processing the rearranged binary data at the second constituent encoder to generate a second output of one or more symbols; and (7) modulate the first output and the second output into a carrier signal. The first constituent encoder and second constituent encoder may be recursive systematic convolutional encoders. The turbo interleaver may further be configured to (1) generate a $k_1 \times k_2$ permutation matrix with values $\pi_i(j)$, where $1 \leq i \leq k_1$ and $0 \leq j \leq k_2 - 1$, and $k_1 \times k_2 = N_{turbo}$, and (2) convert the permutation matrix into the permutation vector.

In one example, converting the permutation matrix into the permutation vector is accomplished by taking the values from two adjacent matrix rows, one matrix column at a time from left to right and from top to bottom until all values in the permutation matrix are read into the permutation vector.

One implementation also provides a processor comprising: (1) an input to receive a binary data stream; (2) a circuit configured to (a) parse the binary data stream into input blocks, (b) rearrange the order of the binary data in a input block according to the predetermined permutation values, and (c) provide an output block having the rearranged binary data.

Another implementation provides a decoder comprising: (a) an input interface to receive a first signal; and (b) a processing unit configured to decode the first signal by identifying a first set of symbols in the first signal that are the interleaved versions of a second set of symbols in the first signal, where the first set of symbols are block interleaved according to a set of predetermined permutation equations.

Yet another implementation provides a machine-readable medium having one or more instructions for encoding a binary data stream, which when executed by a processor causes the processor to (a) encode a received binary data stream with a first coding function to generate a first output; (b) generate a permutation vector having values $\pi(s)$, where $1 \leq s \leq N_{turbo}$ and $N_{turbo}$ is an integer corresponding to a block length of binary data; (c) rearrange the order of the binary data stream according to the permutation vector values $\pi(s)$; (d) encode the rearranged binary data stream with a second coding function to generate a second output; and (e) map the first output and the second output into a carrier signal.

BRIEF DESCRIPTION OF THE DRAWINGS

FIG. 8 illustrates the values of permutation parameters $k_1$ and $k_2$ for various information block lengths $N_{turbo}$ of an exemplary turbo interleaver.

FIG. 9 is a table illustrating an exemplary set of parameters $p_1$, $p_2$, $p_3$, $p_4$, and $c_1$, $c_2$, $c_3$, $c_4$ for the specified information block lengths of a turbo interleaver.

DETAILED DESCRIPTION

In the following description, specific details are given to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, structures and techniques may be shown in detail in order not to obscure the embodiments.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be rearranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read only memory (ROM), random access memory (RAM), magnetic disk storage mediums, optical storage mediums, flash memory devices and/or other machine readable mediums for storing information. The term "machine readable medium" includes, but is not limited to, portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

One feature of the invention provides a turbo code having a low frame error rate. In one implementation, a turbo encoder having parallel concatenated encoders and a block interleaver is configured to rearrange the order of input bits or symbols to improve the distance spectrum of the transmitted redundant data.

Figure 1:
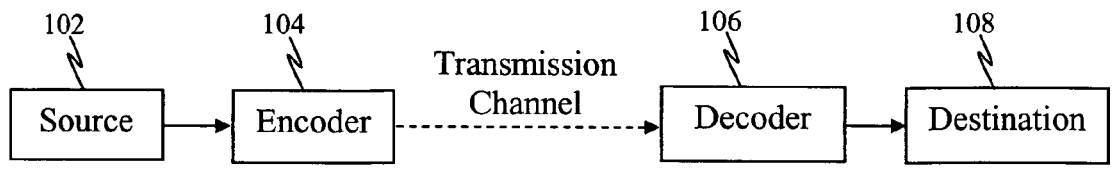
FIG. 1 illustrates a digital communication system with a turbo code encoder.

FIG. 1 illustrates a digital communication system in which a turbo code encoder may be implemented. A data source 102 provides data in digital form to an encoder 104. The encoder 104 includes a turbo interleaver that implements a turbo code according to one implementation. The encoded data is then transmitted over a transmission channel (e.g., wired and/or wireless channel) to a receiver. The receiver includes a turbo decoder 106 that applies a turbo decoder to the received data. The decoded data is then provided to its destination 108.

Figure 2:
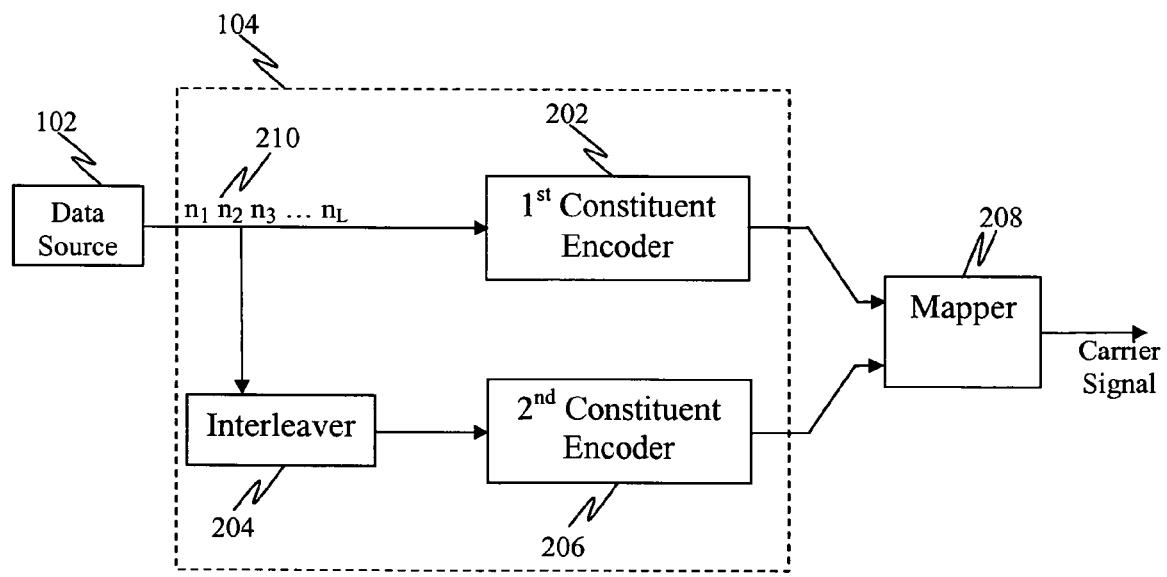
FIG. 2 illustrates a block diagram of one implementation of a turbo encoder.

FIG. 2 illustrates a block diagram of one implementation of a turbo encoder. The turbo encoder includes a first constituent encoder 202 and a second constituent encoder 206. A binary data stream 210 ($n_1, n_2, n_3 \ldots n_L$) is sent to both the first constituent encoder 202 and a turbo interleaver 204. The binary data stream 210 ($n_1, n_2, n_3 \ldots n_L$) may be sampled and/or divided into input blocks. The turbo interleaver 204 may process the binary data stream as a block or frame. Every N data bits received are considered a block having a length $N_{turbo}$. For each specified block length $N_{turbo}$ the turbo code interleaver 204 reorders binary data stream $n_1, n_2, n_3 \ldots N_{turbo}$, according to predetermined permutation equations. The reordered or interleaved binary data stream bits are then sent to the second constituent encoder 206. The bits from the first constituent encoder 202 and second constituent encoder 206 are then sampled into a bit-to-signal/symbol mapper 208 that maps or modulates the redundant bits or symbols from the parallel encoders 202 and 206 into a carrier signal. By rearranging the order of the output bits from the second constituent encoder 206, the distance spectrum of the redundant bits in the carrier signal is increased thereby reducing the bit or frame error rate.

In various implementations one or both of the parallel constituent encoders 202 and 206 may be recursive systematic convolutional encoders or other known types of encoders. In yet other examples of the turbo encoder 104, more than two parallel concatenated encoders and more than one interleaver may be employed.

Figure 3:
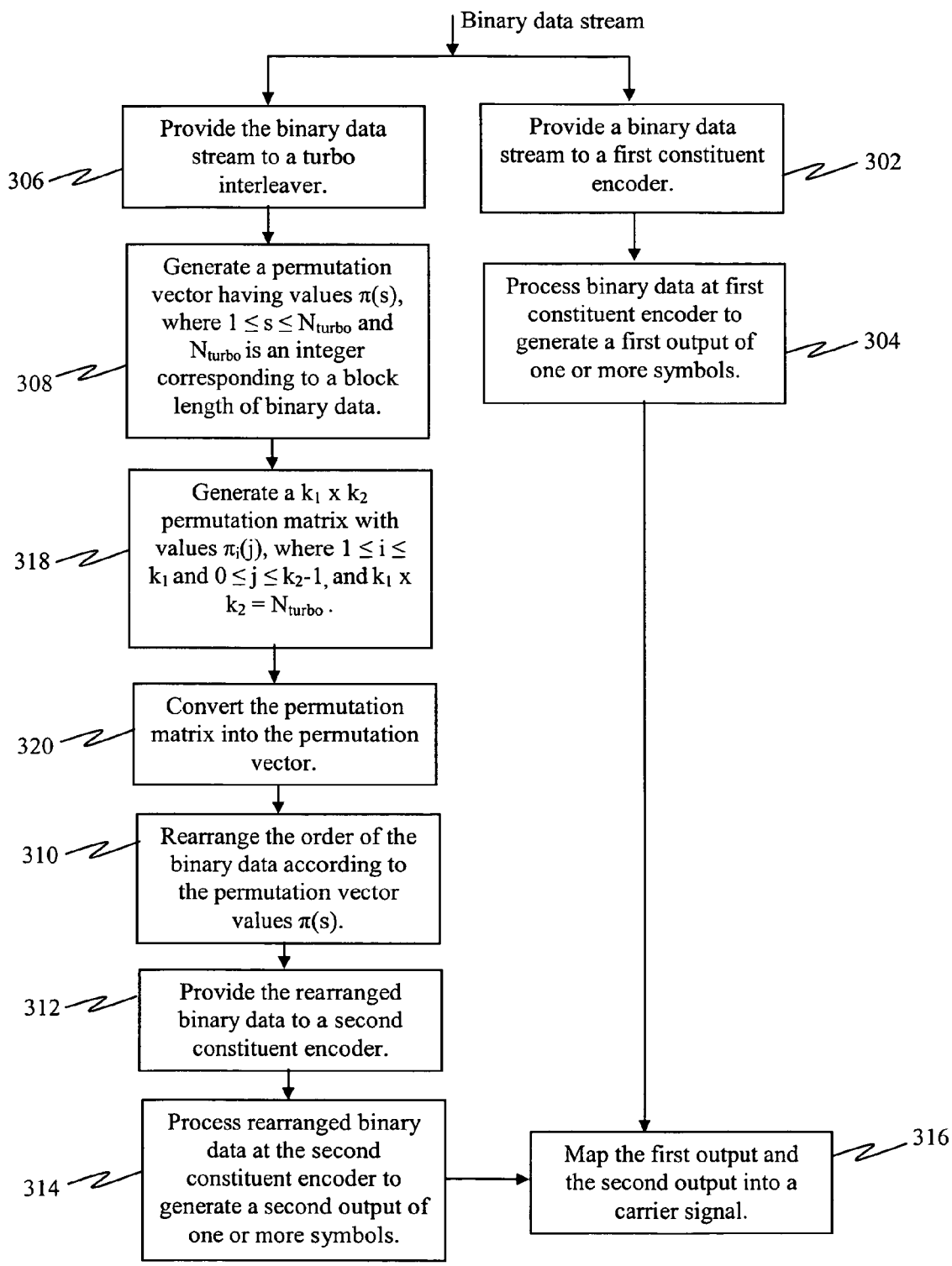
FIG. 3 illustrates a method for encoding binary information on a turbo encoder.

FIG. 3 illustrates a method for encoding binary information on a turbo encoder. A binary data stream is provided to a first constituent encoder 302. The binary data stream is processed at the first constituent encoder to generate a first output of one or more symbols 304. The binary data stream is also provided to a turbo interleaver coupled to a second constituent decoder 306. The turbo interleaver may be configured to (a) generate a permutation vector having values $\pi(s)$, where $1 \leq s \leq N_{turbo}$ and $N_{turbo}$ is an integer corresponding to a block length of binary data 308, and (b) rearrange the order of the binary data according to the permutation vector values $\pi(s)$ 310, and (c) provide the rearranged binary data to the second constituent encoder 312. The rearranged binary data is processed at the second constituent encoder to generate a second output of one or more symbols 314. The first output and the second output are mapped into a carrier signal 316. The turbo interleaver may be further configured to (a) generate a $k_1 \times k_2$ permutation matrix with values $\pi_i(j)$, where $1 \leq i \leq k_1$ and $0 \leq j \leq k_2-1$, and $k_1 \times k_2 = N_{turbo}$ 318, and (b) convert the permutation matrix into the permutation vector 320.

Figure 4:
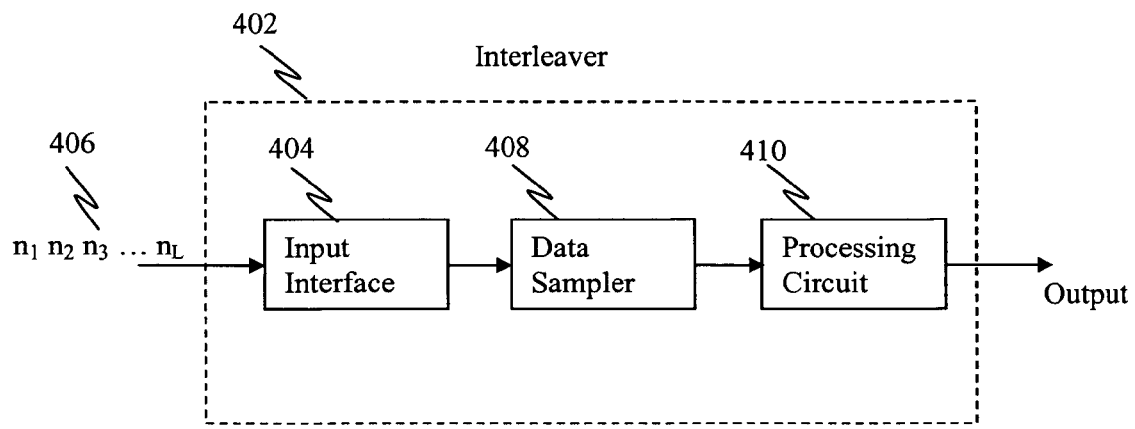
FIG. 4 illustrates a method of operating an interleaver according to one example of a turbo code implementation.

FIG. 4 illustrates a block diagram of one implementation of an interleaver. The interleaver 402 includes an input interface 404 to receive a binary data stream 406, a data sampler 408 communicatively coupled to the input interface 404, and a processing unit 410 communicatively coupled to the data sampler 408. The data sampler 408 is configured to sample and divide the binary data stream into input blocks. In turn, the processing unit 410 is communicatively coupled to the data sampler 408 to rearrange the order of the binary data in the input blocks according to a plurality of predetermined permutation equations and provide output blocks having the rearranged binary data. The processing unit 410 may generate a $k_1 \times k_2$ permutation matrix with values $\pi_i(j)$, where $1 \leq i \leq k_1$ and $0 \leq j \leq k_2-1$, and $k_1 \times k_2 = N_{turbo}$, where $N_{turbo}$ is an integer corresponding to a block length of binary data. The plurality of predetermined permutation equations may define the permutation matrix values $\pi_i(j)$. The processing unit 410 converts the permutation matrix into a permutation vector that defines the order of the rearranged binary data.

Figure 5:
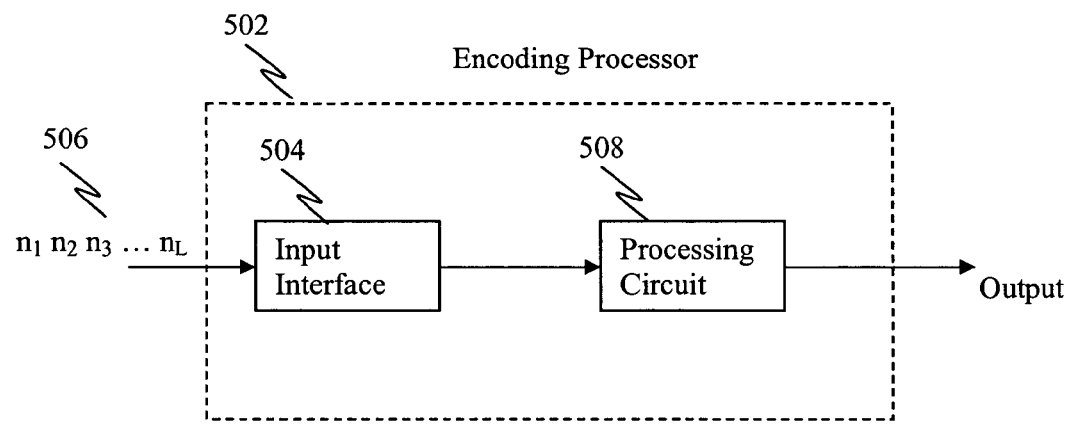
FIG. 5 illustrates a block diagram of one implementation of an encoding processor.

FIG. 5 illustrates a block diagram of one implementation of an encoding processor. The encoding processor 502 includes an input interface 504 to receive a binary data stream 506 and a processing circuit 508. The processing circuit 508 may be configured to divide the binary data stream 506 into input blocks, rearrange the order of the binary data in an input block according to predetermined permutation values, and provide an output block having the rearranged binary data. The processing circuit may generate a $k_1 \times k_2$ permutation matrix with values $\pi_i(j)$, where $1 \leq i \leq k_1$ and $0 \leq j \leq k_2-1$, and $k_1 \times k_2 = N_{turbo}$, $N_{turbo}$ is an integer corresponding to an input block length. The plurality of predetermined permutation equations define the permutation matrix values $\pi_i(j)$. The processing unit 508 converts the permutation matrix into a permutation vector that defines the order of the rearranged binary data.

Figure 6:
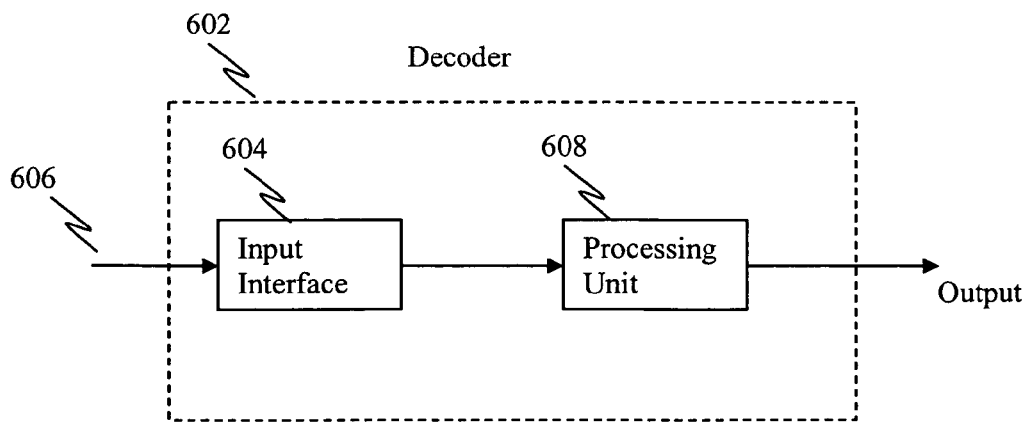
FIG. 6 illustrates a block diagram of one implementation of a decoder.

FIG. 6 illustrates a block diagram of one implementation of a decoder. The decoder 602 includes an input interface 604 to receive a first signal 606 and a processing unit 608 to process the fist signal 606. The processing unit 608 may be configured to decode the first signal 606 by identifying a first set of symbols in the first signal 606 that are the interleaved versions of a second set of symbols in the first signal 606, where the first set of symbols are block interleaved according to a set of predetermined permutation equations.

One or more of the components and functions illustrated in FIGS. 1, 2, 4, 5 and/or 6 may be rearranged and/or combined into a single component or embodied in several components without departing from the invention. Additional elements or components may also be added without departing from the invention.

Figure 7:
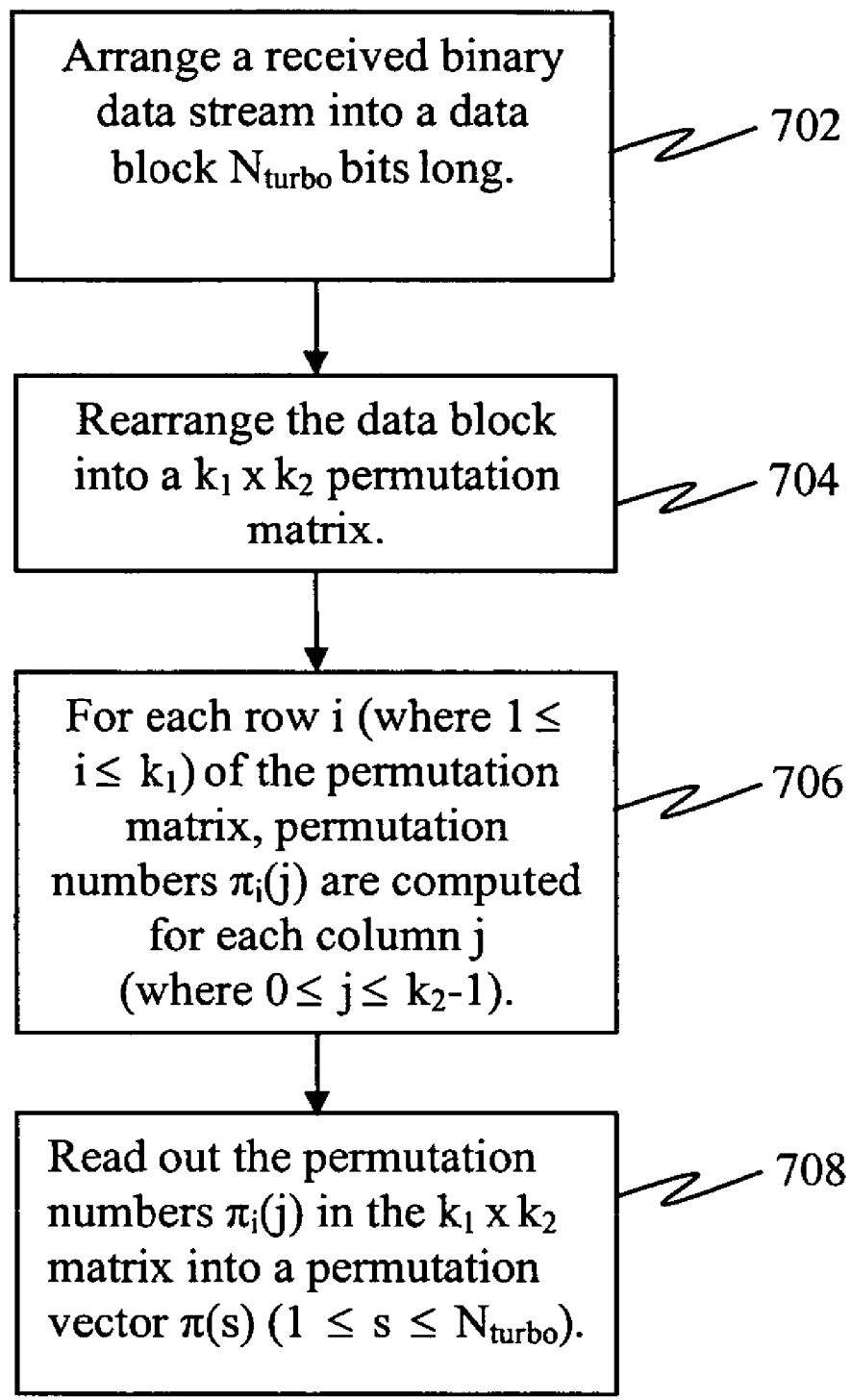
FIG. 7 illustrates a method of operating an interleaver according to one example of a turbo code implementation.

FIG. 7 illustrates a method of operating an interleaver according to one example of a turbo code implementation. The received binary data stream $n_1, n_2, n_3 \ldots n_L$ is arranged as data blocks $N_{turbo}$ bits long 702. Each data block is then rearranged as a $k_1 \times k_2$ permutation matrix 704, where $k_1$ represents the number of rows and $k_2$ the number of columns in the matrix. For each row i (where $1 \leq i \leq k_1$) of the matrix, permutation numbers $\pi_i(j)$ are computed for each column j (where $0 \leq j \leq k_2-1$) 706. The permutation numbers $\pi_i(j)$ in the $k_1 \times k_2$ matrix are read out or converted into a permutation vector $\pi(s)(1 \leq s \leq N_{turbo})$ 708. Note that according to one implementation, the permutation numbers $\pi_i(j)$ may be pre-calculated, stored, and retrieved when they are applied to a data stream. That is, it is not necessary that the permutation numbers $\pi_i(j)$ be determined at the same time that the data stream is processed.

FIG. 8 illustrates the values of permutation parameters $k_1$ and $k_2$ for various information block lengths $N_{turbo}$ of a turbo interleaver. That is, for block lengths of 512, 1024, 2048, 3072, and 4096 bits, the number of rows $k_1$ may be selected to be eight (8) while the number of columns $k_2$ are 64, 128, 256, 384, and 512, respectively.

For each row i (where $1 \leq i \leq k_1$), permutation numbers $\pi_i(j)$ are computed for each column j (where $0 \leq j \leq k_2-1$). One implementation provides the following permutation equations for each of the eight rows of the permutation matrix:

$1^{st}$ row: $\pi_1(j)=k_1*[(p_2*j) \bmod k_2]+4$ $2^{nd}$ row: $\pi_2(j)=k_1*[(p_2*j+c_2) \bmod k_2]+3$ $3^{rd}$ row: $\pi_3(j)=k_1*[(p_1*j) \bmod k_2]+2$ $4^{th}$ row: $\pi_4(j)=k_1*[(p_1*j+c_1) \bmod k_2]+1$ $5^{th}$ row: $\pi_5(j)=k_1*[(p_4*j) \bmod k_2]+8$ $6^{th}$ row: $\pi_6(j)=k_1*[(p_4*j+c_4) \bmod k_2]+7$ $7^{th}$ row: $\pi_7(j)=k_1*[(p_3*j) \bmod k_2]+6$ $8^{th}$ row: $\pi_8(j)=k_1*[(p_3*j+c_3) \bmod k_2]+5$ FIG. 9 is a table illustrating an exemplary set of parameters $p_1$, $p_2$, $p_3$, $p_4$, and $c_1$, $c_2$, $c_3$, $c_4$ for the specified information block lengths of a turbo interleaver. The particular permutation equations (above), parameters $k_1$ and $k_2$ (FIG. 8), and values and combinations of prime numbers $p_1$, $p_2$, $p_3$, $p_4$, and $c_1$, $c_2$, $c_3$, $c_4$ (FIG. 9) were empirically determined to provide an optimal distance spectrum and improved turbo code performance. Using the permutations $\pi_i(j)$ the order or sequence of the input bits or symbols (e.g., $n_1, n_2, n_3 \ldots n_L$) is rearranged by the interleaver. This guarantees that the second constituent encoder 206 receives the input bits or symbols (e.g., $n_1, n_2, n_3 \ldots n_L$) in a different order or sequence than the first constituent encoder 202.

Figures 10, 11:
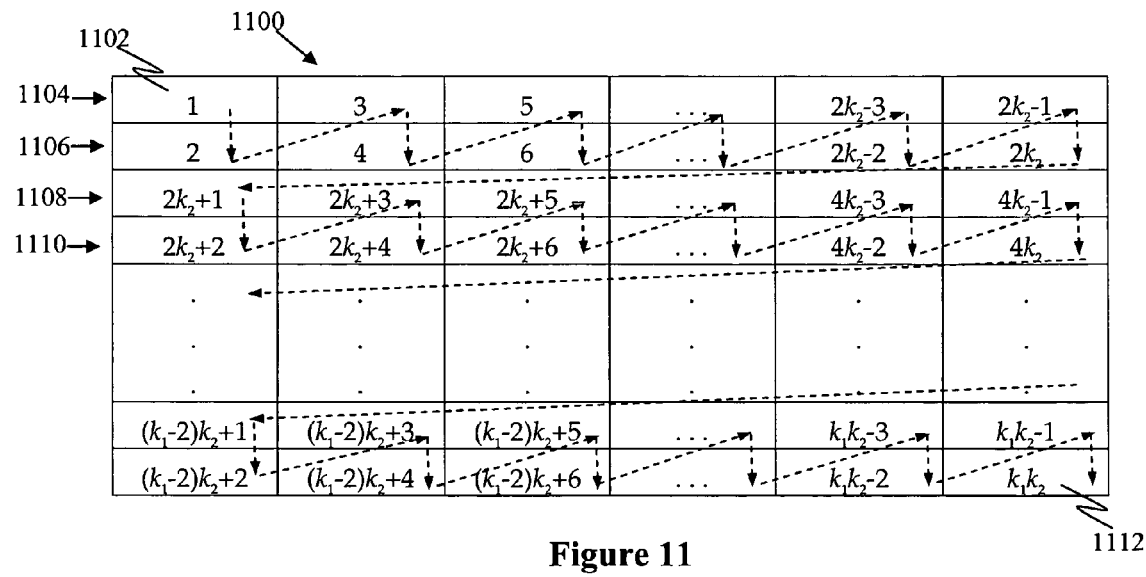
FIG. 10 illustrates an example of how permutation numbers $\pi_i(j)$ are arranged in a $k_1 \times k_2$ matrix in a turbo interleaver.
FIG. 11 illustrates an exemplary order in which the permutation numbers are read out to form a permutation vector.

The permutation numbers $\pi_i(j)$ ($1 \leq i \leq k_1$, $0 \leq j \leq k_2-1$) are rearranged in a $k_1 \times k_2$ matrix. FIG. 10 illustrates an example of how the permutation numbers $\pi_i(j)$ are arranged in a $k_1 \times k_2$ matrix 1000 according to their respective row $k_1$ and column $k_2$.

The permutation numbers $\pi_i(j)$ shown in FIG. 10, are read out into a permutation vector $\pi(s)$ ($1 \leq s \leq N_{turbo}$). FIG. 11 illustrates an exemplary order in which the permutation numbers 1000 are read out to form a permutation vector. According to this example, the permutation numbers $\pi_i(j)$ in matrix 1100 are read out into a vector $\pi(s)$ ($1 \leq s \leq N_{turbo}$) in the sequence shown by the dotted lines. Starting with the permutation numbers in location 1102, the permutation numbers are taken from two rows 1104 and 1106, from left to right, and then continuing in the next two rows 1108 and 1110, from left to right, and so on until the last permutation numbers 1112. In other implementations, the sequence in which the permutation numbers are read from the matrix into the vector may be different.

Figure 12:
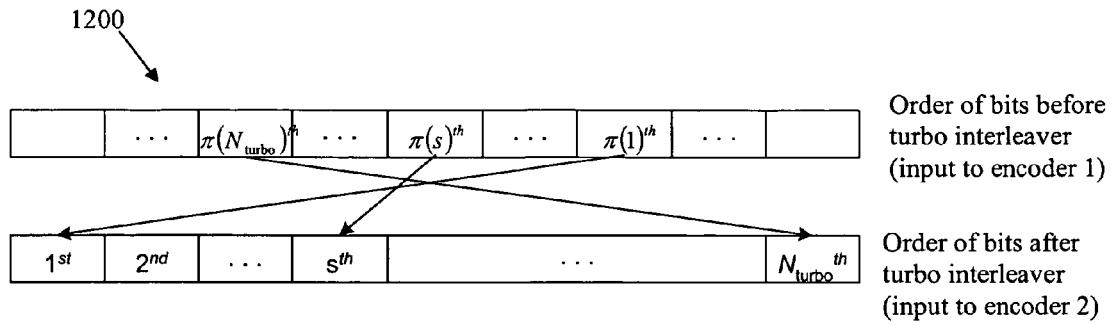
FIG. 12 illustrates how the order of input bits is rearranged by an exemplary interleaver in one implementation of a turbo encoder.

FIG. 12 illustrates how the order of input bits is rearranged by an exemplary interleaver in one implementation of a turbo encoder 1200. The permutation vector $\pi(s)$ ($1 \leq s \leq N_{turbo}$) is such that the $s^{th}$ bit outputted by the turbo interleaver is the $\pi(s)^{th}$ bit of the input information block inputted to the turbo interleaver. That is, the permutation vector dictates the re-sequencing of the bits. In this manner, the block interleaver rearranges the order of input bits to improve the distance spectrum of the transmitted redundant data.

To decode a turbo encoded data signal, the reverse operations are carried out at a receiver to decompose the carrier signal and extract the transmitted information. That is, an inverse permutation vector is determined and applied at the receiver to regain the original bit sequence.

Figure 13:
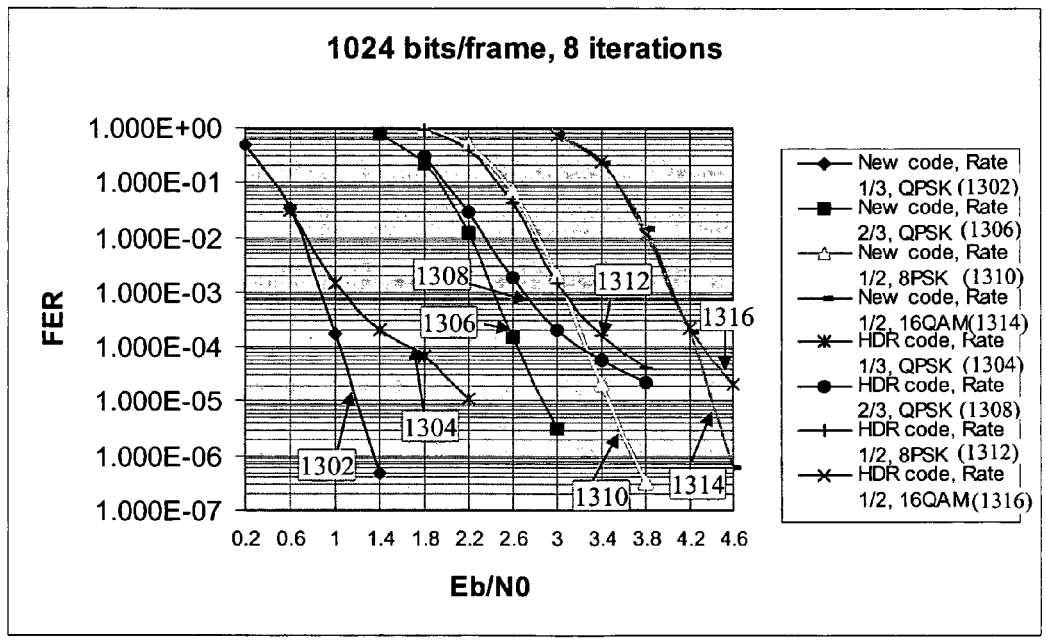
FIG. 13 is a graph illustrating the performance of the turbo code of the present invention in comparison to conventional high data rate (HDR) turbo codes.

FIG. 13 is a graph illustrating the performance of the turbo code (New Code) in comparison to conventional high data rate (HDR) turbo codes. This example illustrates transmissions of 1024 bits/frame with eight decoding iterations at the turbo decoder. For a rate 1/3 QPSK transmission, the improved turbo code line 1302 shows a lower frame error rate (FER) than the conventional turbo code line 1304 for the same signal-to-noise (Eb/N0) ratio. For example, the improved turbo code line 1302 shows a FER of $5 \times 10^{-7}$ which is not achievable with the conventional turbo code line 1304 that has a FER of approximately $2 \times 10^{-4}$ for the same signal-to-noise ratio of 1.4 dB. Similarly, for a rate 2/3 QPSK transmission, the improved turbo code line 1306 shows a FER of $3 \times 10^{-6}$ while the conventional turbo code line 1308 has a FER of $2 \times 10^{-4}$ for the same signal-to-noise ratio of 3 dB. For a rate 1/2 8 PSK transmission, the improved turbo code line 1310 shows a FER of $4 \times 10^{-7}$ while the conventional turbo code line 1312 has a FER of $4 \times 10^{-5}$ for the same signal-to-noise ratio of 3.8 dB. Similarly, for a rate 1/3 16 QAM transmission, the improved turbo code line 1314 shows a FER of $1 \times 10^{-6}$ while the conventional turbo code line 1316 has a FER of $2 \times 10^{-5}$ the same signal-to-noise ratio of 4.6 dB. Thus, the improved turbo code of the present invention provides a much lower error floor than the prior art. This provides a practical turbo coding scheme for applications that require low frame error rate.

It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A turbo encoder comprising:
   a first constituent encoder configured to receive a binary data stream and process the binary data stream to provide a first output of one or more symbols;
   a turbo interleaver configured to rearrange an order of the binary data according to a plurality of predetermined permutation equations, the predetermined permutation equations determining permutation matrix values of a permutation vector that defines the order of the rearranged binary data, the permutation vector formed by reading out the permutation matrix values successively from at least two adjacent rows of a permutation matrix in column order; and
   a second constituent encoder communicatively coupled to the turbo interleaver, the second constituent encoder to receive the rearranged binary data and process the rearranged binary data to provide a second output of one or more symbols.

2. The turbo encoder of claim 1 further comprising:
   a symbol mapper communicatively coupled to the first and second constituent encoders to receive the first and second outputs and map the one or more symbols in the first output and the second output into a carrier signal.

3. The turbo encoder of claim 1 wherein the turbo interleaver is further configured to
   generate the permutation matrix as a $k_1 \times k_2$ permutation matrix with values $\pi_1(j)$, where $1 \leq i \leq k_1$ and $0 \leq j \leq k_2-1$, and $k_1 \times k_2 = N_{turbo}$, $N_{turbo}$ is an integer corresponding to a block length of binary data, wherein the predetermined permutation equations define the permutation matrix values $\pi_i(j)$, and convert the permutation matrix into the permutation vector that defines the order of the rearranged binary data.

4. A turbo encoder comprising:

a first constituent encoder configured to receive a binary data stream and process the binary data stream to provide a first output of one or more symbols;

a turbo interleaver configured to rearrange an order of the binary data according to a plurality of predetermined permutation equations; and a second constituent encoder communicatively coupled to the turbo interleaver, the second constituent encoder to receive the rearranged binary data and process the rearranged binary data to provide a second output of one or more symbols;

wherein the turbo interleaver is further configured to generate a $k_1 \times k_2$ permutation matrix with values $\pi_i(j)$, where $1 \leq i \leq k_1$ and $0 \leq j \leq k_2 - 1$ and $k_1 \times k_2 = N_{turbo}$, $N_{turbo}$ is an integer corresponding to a block length of binary data, wherein the predetermined permutation equations define the permutation matrix values $\pi_i(j)$, and convert the permutation matrix into the permutation vector that defines the order of the rearranged binary data;

wherein the plurality of predetermined permutation equations are defined as:

$1^{st}$ row: $\pi_1(j) = k_1 * [(p_2 * j) \bmod k_2] + 4$ $2^{nd}$ row: $\pi_2(j) = k_1 * [(p_2 * j + c_2) \bmod k_2] + 3$ $3^{rd}$ row: $\pi_3(j) = k_1 * [(p_1 * j) \bmod k_2] + 2$ $4^{th}$ row: $\pi_4(j) = k_1 * [(p_1 * j + c_1) \bmod k_2] + 1$ $5^{th}$ row: $\pi_5(j) = k_1 * [(p_4 * j) \bmod k_2] + 8$ $6^{th}$ row: $\pi_6(j) = k_1 * [(p_4 * j + c_4) \bmod k_2] + 7$ $7_{th}$ row: $\pi_7(j) = k_1 * [(p_3 * j) \bmod k_2] + 6$ $8_{th}$ row: $\pi_8(j) = k_1 * [(p_3 * j + c_3) \bmod k_2] + 5$ where $1 \leq i \leq k_1$, $0 \leq j \leq k_2 - 1$, and $p_1, p_2, p_3, p_4$, and $c_1, c_2, c_3, c_4$ are prime numbers.

5. The turbo encoder of claim 4 wherein the block length $N_{turbo} = 512$ bits, $k_1 = 8$, $k_2 = 64$, $\{p_1, p_2, p_3, p_4\} = \{11, 19, 31, 37\}$, and $\{c_1, c_2, c_3, c_4\} = \{5, 11, 19, 31\}$.

6. The turbo encoder of claim 4 wherein the block length $N_{turbo} = 1024$ bits, $k_1 = 8$, $k_2 = 128$, $\{p_1, p_2, p_3, p_4\} = \{11, 19, 31, 37\}$, and $\{c_1, c_2, c_3, c_4\} = \{5, 11, 19, 31\}$.

7. The turbo encoder of claim 4 wherein the block length $N_{turbo} = 2048$ bits, $k_1 = 8$, $k_2 = 256$, $\{p_1, p_2, p_3, p_4\} = \{13, 23, 31, 37\}$, and $\{c_1, c_2, c_3, c_4\} = \{7, 13, 23, 31\}$.

8. The turbo encoder of claim 4 wherein the block length $N_{turbo} = 3072$ bits, $k_1 = 8$, $k2 = 384$, $\{p_1, p_2, p_3, p_4\} = \{31, 41, 67, 79\}$, and $\{c_1, c_2, c_3, c_4\} = \{13, 23, 29, 41\}$.

9. The turbo encoder of claim 4 wherein the information block length $N_{turbo} = 4096$ bits, $k_1 = 8$, $k_2 = 512$, $\{p_1, p_2, p_3, p_4\} = \{31, 47, 67, 83\}$, and $\{c_1, c_2, c_3, c_4\} = \{13, 23, 31, 47\}$.

10. A method of encoding binary information comprising:

providing a binary data stream to a first constituent encoder;

providing the binary data stream to a turbo interleaver coupled to a second constituent decoder, the turbo interleaver configured to generate a $k_1 \times k_2$ permutation matrix with values $\pi_i(j)$, where $1 \leq i \leq k_1$ and $0 \leq j \leq k_2 - 1$ and $k_1 \times k_2 = N_{turbo}$, Where $N_{turbo}$ is an integer corresponding to a block length of binary data, and convert the permutation matrix into a permutation vector having values $\pi(s)$, where $1 \leq s \leq N_{turbo}$, wherein converting the permutation matrix into the permutation vector includes taking the values from two adjacent matrix rows, one matrix column at a time from left to right and from top to bottom until all values in the permutation matrix are read into the permutation vector; and providing the rearranged binary data to the second constituent encoder.

11. The method of claim 10 further comprising:

processing the binary data stream at the first constituent encoder to generate a first output of one or more symbols;

processing the rearranged binary data at the second constituent encoder to generate a second output of one or more symbols; and mapping the first output and the second output into a carrier signal.

12. The method of claim 10 wherein first constituent encoder and second constituent encoder are recursive systematic convolutional encoders.

13. A turbo encoder comprising:

first means for encoding a binary data stream to provide a first output of one or more symbols;

means for interleaving to rearrange an order of the binary data according to a plurality of predetermined permutation equations, the predetermined permutation equations determining permutation values of a permutation vector that defines the order of the rearranged binary data, the permutation vector formed by successively reading out the permutation values from at least two adjacent rows of a permutation matrix in column order; and second means for encoding the interleaved binary data to provide a second output of one or more symbols.

14. The turbo encoder of claim 13 further comprising: means for mapping the first and second outputs into a carrier signal.

15. An interleaver comprising:

an input interface to receive a binary data stream;

a data sampler communicatively coupled to the input interface, the data sampler configured to sample and divide the binary data stream into input blocks; and a processing unit communicatively coupled to the data sampler to rearrange the order of the binary data in the input blocks according to a plurality of predetermined permutation equations and provide output blocks having the rearranged binary data, the predetermined permutation equations determining permutation matrix values of a permutation vector that defines the order of the rearranged binary data, the permutation vector formed by successively reading out the permutation matrix values from at least two adjacent rows of a permutation matrix in column order.

16. The interleaver of claim 15 where the processing unit farther generates the permutation matrix as a $k_1 \times k_2$ permutation matrix with values $\pi_i$, where $1 \leq i \leq k_1$ and $0 \leq j \leq k_2 - 1$, and $k_1 \times k_2 = N_{turbo}$, $N_{turbo}$ is an integer corresponding to a block length of binary data, wherein the plurality of predetermined permutation equations define the permutation matrix values $\pi_i(j)$, and converts the permutation matrix into the permutation vector that defines the order of the rearranged binary data.

17. An interleaver comprising:
an input interface to receive a binary data stream;
a data sampler communicatively coupled to the input interface, the data sampler configured to sample and divide the binary data stream into input blocks; and
a processing unit communicatively coupled to the data sampler to rearrange the order of the binary data in the input blocks according to a plurality of predetermined permutation equations and provide output blocks having the rearranged binary data;
where the processing unit further generates a $k_1 \times k_2$ permutation matrix with values $\pi_i(j)$, where $1 \leq i \leq k_1$ and $0 \leq j \leq k_2-1$ and $k_1 \times k_2 = N_{turbo}$, $N_{turbo}$ is an integer corresponding to a block length of binary data, wherein the plurality of predetermined permutation equations define the permutation matrix values $\pi_i(j)$, and
converts the permutation matrix into a permutation vector that defines the order of the rearranged binary data;
wherein the plurality of predetermined permutation equations are defined as:

$1^{st}$ row: $\pi_1(j)=k_1*\{(p_2*j) \bmod k_2\}+4$ $2^{nd}$ row: $\pi_2(j)=k_1*\{(p_2*j+c_2) \bmod k_2\}+3$ $3^{rd}$ row: $\pi_3(j)=k_1*\{(p_1*j) \bmod k_2\}+2$ $4^{th}$ row: $\pi_4(j)=k_1*\{(p_1*j+c_1) \bmod k_2\}+1$ $5^{th}$ row: $\pi_5(j)=k_1*\{(p_4*j) \bmod k_2\}+8$ $6^{th}$ row: $\pi_6(j)=k_1*\{(p_4*j+c_4) \bmod k_2\}+7$ $7^{th}$ row: $\pi_7(j)=k_1*\{(p_3*j) \bmod k_2\}+6$ $8^{th}$ row: $\pi_8(j)=k_1*\{(p_3*j+c_3) \bmod k_2\}+5$ where $1 \leq i \leq k_1$, $0 \leq j \leq k_2-1$, and $p_1, p_2, p_3, p_4$, and $c_1, c_2, c_3, c_4$ are prime numbers.

18. A processor comprising:
an input to receive a binary data stream; and
a circuit configured to
divide the binary data stream into input blocks,
rearrange an order of the binary data in an input block according to predetermined permutation values of a permutation vector, the permutation vector formed by reading out the permutation values successively from at least two adjacent rows of a permutation matrix in column order, and
provide an output block having the rearranged binary data.

19. A processor comprising:
an input to receive a binary data stream; and
a circuit configured to divide the binary data stream into input blocks,
rearrange an order of the binary data in an input block according to predetermined permutation values, and
provide an output block having the rearranged binary data:
wherein the circuit is further configured to generate a $k_1 \times k_2$ permutation matrix with values $\pi_i(j)$, where $1 \leq i \leq k_1$ and $0 \leq j \leq k_2-1$ and $k_1 \times k_2 = N_{turbo}$, $N_{turbo}$ is an integer corresponding to an input block length, the plurality of predetermined permutation equations define the permutation matrix values $\pi_i(j)$,
convert the permutation matrix into a permutation vector that defines the order of the rearranged binary data,
wherein the predetermined permutation values $\pi_i(j)$ are calculated based on the equations:

$1^{st}$ row: $\pi_1(j)=k_1*[(p_2*j) \bmod k_2]+4$ $2^{nd}$ row: $\pi_2(j)=k_1*[(p_2*j+c_2) \bmod k_2]+3$ $3^{rd}$ row: $\pi_3(j)=k_1*[(p_1*j) \bmod k_2]+2$ $4^{th}$ row: $\pi_4(j)=k_1*[(p_1*j+c_1) \bmod k_2]+1$ $5^{th}$ row: $\pi_5(j)=k_1*[(p_4*j) \bmod k_2]+8$ $6^{th}$ row: $\pi_6(j)=k_1*[(p_4*j+c_4) \bmod k_2]+7$ $7^{th}$ row: $\pi_7(j)=k_1*[(p_3*j) \bmod k_2]+6$ $8^{th}$ row: $\pi_8(j)=k_1*[(p_3*j+c_3) \bmod k_2]+5$ where $1 \leq i \leq k_1$, $0 \leq j \leq k_2-1$, and $p_1, p_2, p_3, p_4$, and $c_1, c_2, c_3, c_4$ are predetermined prime numbers.

20. A decoder comprising:
an input interface to receive a first signal; and
a processing unit configured to decode the first signal by identifying a first set of symbols in the first signal that are the interleaved versions of a second set of symbols in the first signal, where the first set of symbols are block interleaved according to a set of predetermined permutation equations, the predetermined permutation equations determining permutation values of a permutation vector that defines the order of the rearranged binary data, the permutation vector formed by reading out the permutation values successively from at least two adjacent rows of a permutation matrix in column order.

21. A decoder comprising:
an input interface to receive a first signal; and
a processing unit configured to decode the first signal by identifying a first set of symbols in the first signal that are the interleaved versions of a second set of symbols in the first signal, where the first set of symbols are block interleaved according to a set of predetermined permutation equations;
wherein the determined permutation equations are defined as:

$1^{st}$ row: $\pi_1(j)=k_1*[(p_2*j) \bmod k_2]+4$ $2^{nd}$ row: $\pi_2(j)=k_1*[(p_2*j+c_2) \bmod k_2]+3$ $3^{rd}$ row: $\pi_3(j)=k_1*[(p_1*j) \bmod k_2]+2$ $4^{th}$ row: $\pi_4(j)=k_1*[(p_1*j+c_1) \bmod k_2]+1$ $5^{th}$ row: $\pi_5(j)=k_1*[(p_4*j) \bmod k_2]+8$ $6^{th}$ row: $\pi_6(j)=k_1*[(p_4*j+c_4) \bmod k_2]+7$ $7^{th}$ row: $\pi_7(j)=k_1*[(p_3*j) \bmod k_2]+5$ $8^{th}$ row: $\pi_8(j)=k_1*[(p_3*j+c_3) \bmod k_2]+5$ where $1 \leq i \leq k_1$, $0 \leq j \leq k_2-1$, and $p_1, p_2, p_3, p_4$, and $c_1, c_2, c_3, c_4$ are predetermined prime numbers.

22. A decoder comprising:
means for receiving a first signal; and
means for processing the first signal by identifying a first set of symbols in the first signal that are the interleaved versions of a second set of symbols in the first signal, where the first set of symbols are block interleaved according to a set of predetermined permutation equations, the predetermined permutation equations determining permutation values of a permutation vector that defines the order of the rearranged binary data, the permutation vector formed by reading out the permutation values successively from at least two adjacent rows of a permutation matrix in column order.

23. A machine-readable medium tangibly embodying one or more instructions for instructions for encoding a binary data stream, which when executed by a processor causes the processor to:

encode a received binary data stream with a first coding function to generate a first output;

generate a permutation vector having values $\pi(s)$, where $1 \leq s \leq N_{turbo}$ and $N_{turbo}$ is an integer corresponding to a block length of binary data, and where the permutation vector is formed by reading out the values $\pi(s)$ successively from at least two adjacent rows of a permutation matrix in column order;

rearrange the order of the binary data stream according to the permutation vector values $\pi(s)$; and encode the rearranged binary data stream with a second coding function to generate a second output.

24. The machine-readable medium of claim 23 the instructions when executed further causing the processor to:

map the first output and the second output into a carrier signal.

* * * * *